US009942657B2

(12) United States Patent
Lawrence et al.

(10) Patent No.: US 9,942,657 B2
(45) Date of Patent: Apr. 10, 2018

(54) LOUDSPEAKER PROTECTION

(71) Applicant: Cirrus Logic International Semiconductor Ltd., Edinburgh (GB)

(72) Inventors: Jason William Lawrence, Austin, TX (US); Roger David Serwy, Austin, TX (US); Roberto Napoli, Edinburgh (GB)

(73) Assignee: Cirrus Logic, Inc., Austin, TX (US)

(*) Notice: Subject to any disclaimer, the term of this patent is extended or adjusted under 35 U.S.C. 154(b) by 0 days.

(21) Appl. No.: 15/186,992

(22) Filed: Jun. 20, 2016

(65) Prior Publication Data

US 2016/0373858 A1 Dec. 22, 2016

Related U.S. Application Data

(60) Provisional application No. 62/183,025, filed on Jun. 22, 2015.

(30) Foreign Application Priority Data

Sep. 2, 2015 (GB) .................................. 1515535.1

(51) Int. Cl.
*H03G 11/00* (2006.01)
*H04R 3/00* (2006.01)
(Continued)

(52) U.S. Cl.
CPC ............... *H04R 3/007* (2013.01); *H04R 3/04* (2013.01); *H04R 29/003* (2013.01)

(58) Field of Classification Search
CPC ......... H04R 29/003; H04R 3/007; H04R 3/04
(Continued)

(56) References Cited

U.S. PATENT DOCUMENTS 7,184,556 B1 * 2/2007 Johnson ................. H03G 5/005
381/59
9,060,217 B2 6/2015 Thormundsson et al.
(Continued)

FOREIGN PATENT DOCUMENTS

WO 2012/096897 A1 7/2012

OTHER PUBLICATIONS

Leo Kirchner, Loudspeaker measurements, 2007, Kirchner electronik, pp. 1-52.*
(Continued)

*Primary Examiner* — Vivian Chin
*Assistant Examiner* — Friedrich W Fahnert
(74) *Attorney, Agent, or Firm* — Jackson Walker L.L.P.

(57) ABSTRACT

This application relates to methods and apparatus for loudspeaker protection. A loudspeaker protection system (100) receives a digital audio signal comprising a plurality of samples at an input node (IN). A delay block (15) delays the digital audio signal and a gain block (14) applies a controlled gain to the delayed digital audio signal. An excursion predictor (12) is configured to receive a version of the audio signal from the signal path upstream of the delay block and determine a predicted excursion for a loudspeaker based on the audio signal. A gain controller (23) controls a gain setting (g) of the gain block in response to the predicted excursion and a first loudspeaker impulse response model and a predetermined excursion limit. The gain controller (23) is configured to determine at least one gain setting $\{g_a \ldots g_i\}$ to be applied to a set of samples $\{V_a \ldots V_i\}$ of the audio signal delayed by the delay block where the set of samples of the audio signal corresponds to a time-span which is less than an impulse response settling time of the loudspeaker.

19 Claims, 9 Drawing Sheets

(51) Int. Cl.
*H04R 3/04* (2006.01)
*H04R 29/00* (2006.01)

(58) Field of Classification Search
USPC .................................... 381/55, 56, 58, 59, 61
See application file for complete search history.

(56) References Cited

U.S. PATENT DOCUMENTS

| | | | | |
|---|---|---|---|---|
| 9,614,489 | B2 * | 4/2017 | Cheng | H03G 9/025 |
| 2006/0104451 | A1 * | 5/2006 | Browning | H04R 29/003 381/59 |
| 2009/0028350 | A1 * | 1/2009 | Kim | H04R 3/04 381/59 |
| 2009/0268918 | A1 | 10/2009 | Solgaard et al. | |
| 2013/0259245 | A1 * | 10/2013 | Cheng | H04R 3/00 381/58 |
| 2015/0010168 | A1 | 1/2015 | Cheng et al. | |
| 2015/0215704 | A1 * | 7/2015 | Magrath | H04R 9/022 381/55 |
| 2015/0304772 | A1 * | 10/2015 | Risberg | H04R 3/007 381/55 |
| 2016/0241350 | A1 * | 8/2016 | Nekhamkin | G10L 19/0019 |

OTHER PUBLICATIONS

International Search Report and Written Opinion of the International Searching Authority, International Application No. PCT/GB2016/051850, dated Sep. 30, 2016, 13 pages.
Combined Search and Examination Report, UKIPO, Application No. GB1706841.2, dated May 17, 2017.

* cited by examiner

LOUDSPEAKER PROTECTION

FIELD OF DISCLOSURE

The field of representative embodiments of this disclosure relates to methods, apparatuses, and/or implementations concerning and/or relating to protecting loudspeakers and/or other similar output transducers, and more particularly to controlling the drive signal supplied to a loudspeaker so as to avoid and/or limit excessive diaphragm excursion.

BACKGROUND

A number of different products include audio circuitry, such as an audio amplifier, together with one or more loudspeakers and/or connections for driving one or more loudspeakers of an integrated apparatus such as a mobile phone, i.e. handset, and/or peripheral apparatus such as a headset, e.g. earbuds, headphones, hearing aids and Bluetooth™ devices. In some instances the loudspeaker(s) chosen will be robust enough and sized sufficiently to handle the maximum power level at which the amplifier could drive signals continuously into it, even under the worst case environmental conditions, for instance maximum supply voltage, maximum ambient temperature etc. However having robust enough loudspeakers is not always economical, and for portable devices such as mobile phones or tablets and headsets and the like the desire is typically to make the speaker as small and light as possible. This can potentially lead to the audio drive circuitry overloading the loudspeaker. One particular problem is mechanical damage due to excessive and/or prolonged displacement or excursion of the speaker mechanism.

It is known to provide circuitry to estimate the displacement of a speaker over time from the voltage applied to the speaker using a plant model, i.e. a model of how the speaker reacts, and to reduce the applied signal if over-excursion is predicted. FIG. 1 illustrates a speaker driver system for driving loudspeaker 10 via output amplifier circuitry 11. The system receives, at an input node IN, an input signal V representing the output voltage Vout to be driven into the loudspeaker 10. The input signal V is also applied to an excursion prediction block 12 which uses a plant model to provide an estimate x of the speaker coil excursion. Gain calculator block 13 then compares this predicted excursion x with some predefined excursion or displacement limit xlim. If the estimated excursion x exceeds the limit xlim then a reduced gain value is calculated, for example equal to xlim/xi, and a corresponding reduced gain is applied to the input signal, e.g. by a gain adjustment element 14 that is upstream of the loudspeaker in the signal path, so as to attenuate the input signal and hence reduce the speaker excursion to less than the limit xlim.

The loudspeaker 10 may have substantial time constants associated with its mechanical inertia and the inertia of the air volume to be driven. This may be expressed in terms of the settling time of its impulse response which may extend over several milliseconds. There will thus be a delay between when the input signal V is received by the speaker 10 and when the full extent of its effect on the voice coil excursion is experienced and thus recognised by the excursion prediction block 12. Thus the input signal V is passed via a delay block 15 to apply a delay d in the signal path between the signal input node IN and the gain adjustment element 14 so that the reduced gain may be applied to a delayed version Vd of the input signal stream early enough, i.e. to the portion of the signal stream Vd that actually would have produced the over-excursion if it had been allowed to be applied to the loudspeaker 10.

This delay d may be acceptable in some applications, but in some applications such as telephony, e.g. wireless communication, especially in speakerphone type operation, such a delay d might cause problems and therefore be disadvantageous.

SUMMARY

Embodiments of the present invention provide methods and/or apparatus for speaker protection that at least mitigate at least some of the above mentioned disadvantages.

The description below sets forth example embodiments according to this disclosure. Further example embodiments and implementations will be apparent to those having ordinary skill in the art. Further, those having ordinary skill in the art will recognize that various equivalent techniques may be applied in lieu of, or in conjunction with, the embodiments discussed below, and all such equivalents should be deemed as being encompassed by the present disclosure.

Thus according to an aspect of the present invention there is provided a loudspeaker protection system comprising:

- an input node for receiving a digital audio signal comprising a plurality of samples;
- a delay block for delaying the digital audio signal;
- a gain block for applying a controlled gain to the delayed digital audio signal output from the delay block;
- an excursion predictor configured to receive a version of the audio signal from the signal path upstream of the delay block and determine a predicted excursion for a loudspeaker based on the audio signal; and
- a gain controller for controlling a gain setting of the gain block in response to the predicted excursion and a first loudspeaker impulse response model and a predetermined excursion limit,
- wherein the gain controller is configured to determine at least one gain setting to be applied to a set of samples of the audio signal delayed by the delay block; and
- wherein said set of samples of the audio signal correspond to a time-span which is less than an impulse response settling time of the loudspeaker.

The set of samples may comprise a sample of the audio signal delayed by the delay block that corresponds to the most recent sample of the audio signal on which the relevant predicted excursion is based and a predetermined number of preceding samples.

In some embodiments the excursion predictor is configured to determine a predicted excursion in response to each new sample of the audio signal. In this case, in response to each predicted excursion the gain controller may be configured to determine the at least one gain setting to be applied to a respective set of samples.

The gain controller may be configured to determine a set of gain settings, the set of gain settings comprising a respective gain setting for each of the samples in said set.

In some embodiments each of the gain settings of said set of gain settings have the same value as one another.

In some embodiments the gain controller may be configured to determine the set of gain settings according to a gain profile. The set of gain settings may be based on a common gain factor applied to all gain settings and a gain profile value that is predetermined for the respective gain setting in the set. In some examples the gain profile may correspond to a linear ramp in gain, although other gain profiles may also be used. The gain controller may be configured to determine the common gain factor for the set of gain settings based on the predicted excursion and an excursion limit. In some instances the gain profile may be variable based on a gain profile control setting.

The first loudspeaker impulse response model may comprise a first series of impulse response coefficients. The impulse response coefficients of the first series may be variable based on a coefficient setting.

The excursion predictor may be configured to determine the predicted excursion based on the audio signal and a second loudspeaker impulse response model. The second loudspeaker impulse response model may comprise a second series of impulse response coefficients. The impulse response coefficients of the second series may be variable based on a coefficient setting. In some embodiments the second loudspeaker impulse response model may be the same as the first loudspeaker impulse response model, however different models may be used in some embodiments.

The delay block delays the audio signal for a delay time which may be less than the impulse response settling time of the loudspeaker. For example the delay time may be in the range of 80% to 15% of the impulse response settling time of the loudspeaker. In some embodiments the delay time of the delay block is less than or equal to 2 ms, or less than or equal to 1 ms or less than or equal to 500 μs.

The set of samples of the audio signal may correspond to a time-span which in the range of 80% to 15% of the impulse response settling time of the loudspeaker. In some embodiments the time-span of the set of samples may be less than or equal to 2 ms, or less than or equal to 1 ms or less than or equal to 500 μs.

The impulse response settling time of the loudspeaker may be seen as the duration of the first two lobes of impulse response. The impulse response settling time of the loudspeaker may be seen as the time taken for an impulse response envelope to decay to 5% of its peak value. The impulse response settling time of the loudspeaker may be seen as the time taken for a step response to settle to 1%.

In some embodiments the gain controller may determine a first set of gain settings for a first set of samples of the audio signal delayed by the delay block based on a first predicted excursion and subsequently determines at least a second subsequent set of gain settings for a second set of samples of the audio signal delayed by the delay block based on a subsequent predicted excursion. The second set of samples may partly overlap with the first set of samples. In such a case the gain controller may be configured to use, for any sample in both the first and second sets, the lowest respective gain setting of the first and second sets of gain settings that correspond to that sample.

In some embodiments the gain controller is further configured to determine said at least one gain setting for the set of samples based on a constraint on velocity of the loudspeaker coil.

In some embodiments the gain controller is configured to determine the at least one gain setting for a set of samples in a frequency band that corresponds to a subset of the frequency range of the audio signal.

The loudspeaker protection system as described in any of the variants above may be implemented as an integrated circuit.

In some embodiments an apparatus comprising a loudspeaker protection system as described in any of the variants above may be arranged downstream of another, i.e. a first, excursion limiter.

Aspects also relate to an apparatus comprising a loudspeaker protection system as described in any of the variants above.

The apparatus may further comprise a digital-to-analogue converter downstream of the gain block and/or an amplifier downstream of the gain block.

The apparatus may further comprise a loudspeaker configured to be driven by a drive signal wherein the drive signal is derived from the output of the gain block.

The apparatus may be at least one of: a portable device; a battery powered device; a wearable device; a computing device; a communications device; a gaming device; a mobile telephone; a personal media player; a laptop, tablet or notebook computing device.

In another aspect there is provided a loudspeaker excursion limiter comprising:

- an input for receiving digital input signal comprising a stream of samples;
- an output for outputting an audio signal for a loudspeaker;
- a signal path from said input to said output comprising a delay block and a gain block, wherein the gain block is downstream of the delay block and applies a gain controlled by a gain calculation block; and
- an excursion predictor block configured to estimate loudspeaker excursion based on the digital input signal and a first loudspeaker model;

wherein:

- said gain calculation block determines a set of gains to be applied to a sequential set of delayed samples based on the currently estimated loudspeaker excursion, a predefined excursion limit and a loudspeaker impulse response model; and the time-span of said sequential set of delayed samples is less than a loudspeaker impulse response settling time.

In a further aspect there is provided a loudspeaker protection system comprising:

- a signal path for an audio signal between an input node and an output node, said audio signal path comprising a delay block for delaying the audio signal and a gain block for applying a controlled gain to the audio signal output from the delay block;
- an excursion predictor configured to receive a version of the audio signal from the signal path upstream of the delay block and determine a predicted excursion for a loudspeaker based on the audio signal; and
- a gain controller for controlling a gain setting of the gain block in response to the predicted excursion and a loudspeaker impulse response model,
- wherein the gain controller is configured to determine at least one gain setting to be applied to a segment of the audio signal delayed by the delay block so as to limit the predicted excursion to an excursion limit;
- wherein said segment of the audio signal has a duration which is less than a first duration, the first duration corresponding to an impulse response settling time of the loudspeaker.

Aspects also relate to a system for limiting the excursion of an output transducer comprising:

- an excursion predictor for determining a predicted excursion of an output transducer to an audio signal received at an input node; and
- a gain controller for controlling the gain applied to the audio signal by a gain block in response to the predicted excursion and an excursion limit;

wherein the propagation delay in the audio signal path between the input node and the gain block is less than an impulse response settling time of the output transducer.

The propagation delay may for instance be within the range of 80% to 15% of the impulse response settling time of the output transducer.

Aspects also relate to a system for limiting the excursion of an output transducer comprising:

an excursion predictor for determining a predicted excursion of an output transducer to an audio signal received at an input node; and a gain controller for controlling the gain applied to the audio signal by a gain block in response to the predicted excursion and an excursion limit; and a delay block for applying a delay in the audio signal path between the input node and the gain block, wherein said delay is less than 1 ms.

Also provided is a system for limiting the excursion of an output transducer comprising:

an excursion predictor for determining a predicted excursion of an output transducer to an audio signal received at an input node; and a gain controller for controlling the gain applied to the audio signal by a gain block in response to the predicted excursion and based on an excursion limit and an impulse response model of the output transducer.

BRIEF DESCRIPTION OF THE DRAWINGS

Embodiments of the invention will now be described, by way of example only, with reference to the accompanying drawings, of which.

DESCRIPTION

Figure 2:
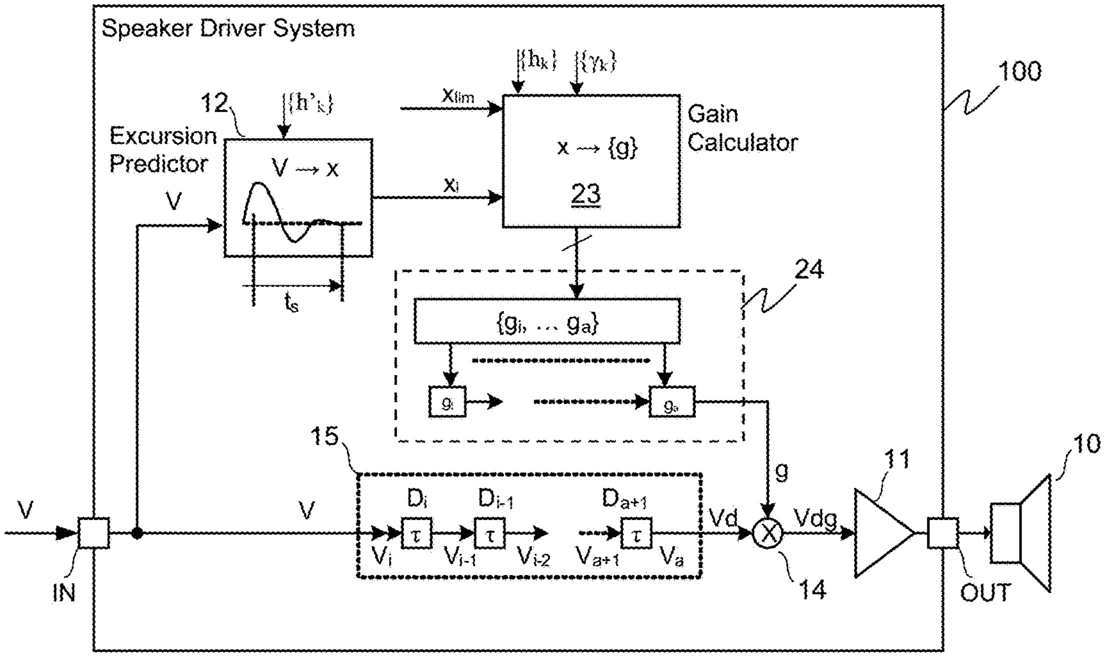
FIG. 2 illustrates a speaker driver system comprising an excursion limiter according to an embodiment.

FIG. 2 illustrates a speaker driver system comprising an embodiment of a speaker protection system or speaker protection block 100 that provides excursion limiting protection for a loudspeaker.

Note that as used herein the term ‘block’ shall be used to refer to a functional unit or module which may be implemented at least partly by dedicated hardware components such as custom defined circuitry and/or at least partly be implemented by one or more software processors or appropriate code running on a suitable general purpose processor or the like. A block may itself comprise other blocks or functional units.

Figure 1:
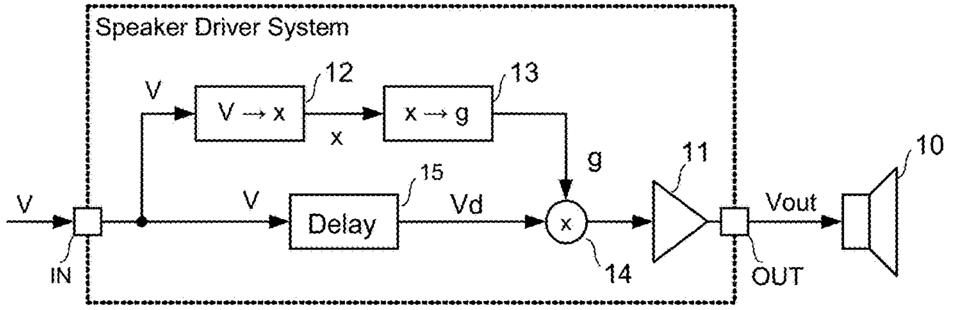
FIG. 1 illustrates a speaker driver system providing excursion limiting.

As in FIG. 1, this speaker protection block 100 receives an input audio signal V at an input terminal or input node IN and provides an output signal Vout at an output terminal or output node OUT for forwarding to a loudspeaker 10, e.g. via a driver amplifier 11. The input signal V may be a stream of digital samples at some suitable sample rate say 48 ks/s. The digital samples may be of some suitable resolution as required to give suitable dynamic range in terms of maximum range and quantisation noise. The driver amplifier block 11 may comprise digital-to-analogue conversion circuitry so as to apply an analogue signal to the loudspeaker 10. The input signal V may be derived from some upstream analogue signal via an analogue-to-digital convertor.

The input signal V is also applied to an excursion prediction block 12 which uses an electro-mechanical plant model to provide an estimate x of the speaker coil excursion. The plant model may comprise coefficients $\{h'_k\}$ corresponding to an electro-mechanical model of the speaker, for example coefficients of the speaker impulse response or step response or of a digital filter of some topology. This model may be characterised by a settling time $t_s$, which may for example be defined as: the duration of some number of lobes, say three, of the speaker impulse response; the time taken for the envelope of the impulse response to decay to say 5% of peak magnitude; the time taken for the envelope of the step response to decay to say 1% of the peak value; a multiple of the time constant of the lowest frequency pole of the response; or some other similar metric of the speaker electro-mechanical response corresponding to the duration of any significant effect or any combination of the aforementioned.

Gain calculator block 23 then accepts this estimated speaker excursion x and a predetermined value of the excursion limit xlim and generates an appropriate gain value g to be applied to a delayed version Vd of the input signal V by gain element 14, which is located in the signal path before the loudspeaker 10, so as to attenuate the delayed input signal Vd by a factor g and hence reduce the speaker excursion to less than the provided maximum displacement value xlim.

However in contrast to the arrangement illustrated in FIG. 1, rather than the gain values being set equal to the current value of the ratio of x/xlim, possibly with some attack or decay or hold dynamics being used to ensure the gain reduction spans the whole settling time $t_s$ of the speaker response, in this embodiment a set of gain values $\{g_a \ldots g_i\}$ are calculated together, to be applied to a respective set of successive samples of the delayed audio signal Vd, where the set of samples to which the set of gains are applied corresponds to a total time-span much shorter than the settling time $t_s$. As discussed in more detail below, merely setting the gain to the current value of the ratio of x/xlim will not be adequate to avoid over-excursion, therefore an alternative set of calculations needs to be performed.

In some embodiments the gain values in a given set $\{g_a \ldots g_i\}$ will all be equal to one another in order to maximise their total effect: in other embodiments or modes the gain values may follow some profile, for example a ramp or S-shape, in order to avoid any audio artefacts the may result from sudden gain changes. Such a profile may be determined by a set of coefficients $\{y_k\}$ that are input to the gain calculator 23. In some embodiments the gain calculation may use the impulse response of the speaker which may be defined by coefficients $\{h_k\}$ that are input to the gain calculator 23.

The respective set of gain values $\{g_a \ldots g_i\}$ to be applied to the respective delayed input signal stream samples Vd include gains to be applied to past input signal samples, i.e. those which have already been input to the excursion predictor block 12. Thus the signal Vdg in the main signal path via the gain block 14 to the loudspeaker 10 needs to be delayed prior to the gain block 14 and after an input IN to the excursion predictor block 15 is tapped off. Thus a delay block 15 is inserted in this path as shown.

The delay block 15 is illustrated as a series chain of delay elements, $D_a \ldots D_i$, each delaying the signal by one sample period. In some embodiments the delay elements may be implemented using other means, for instance as an area of memory addressed by suitable read-write pointers, e.g. a circular buffer.

Figure 3:
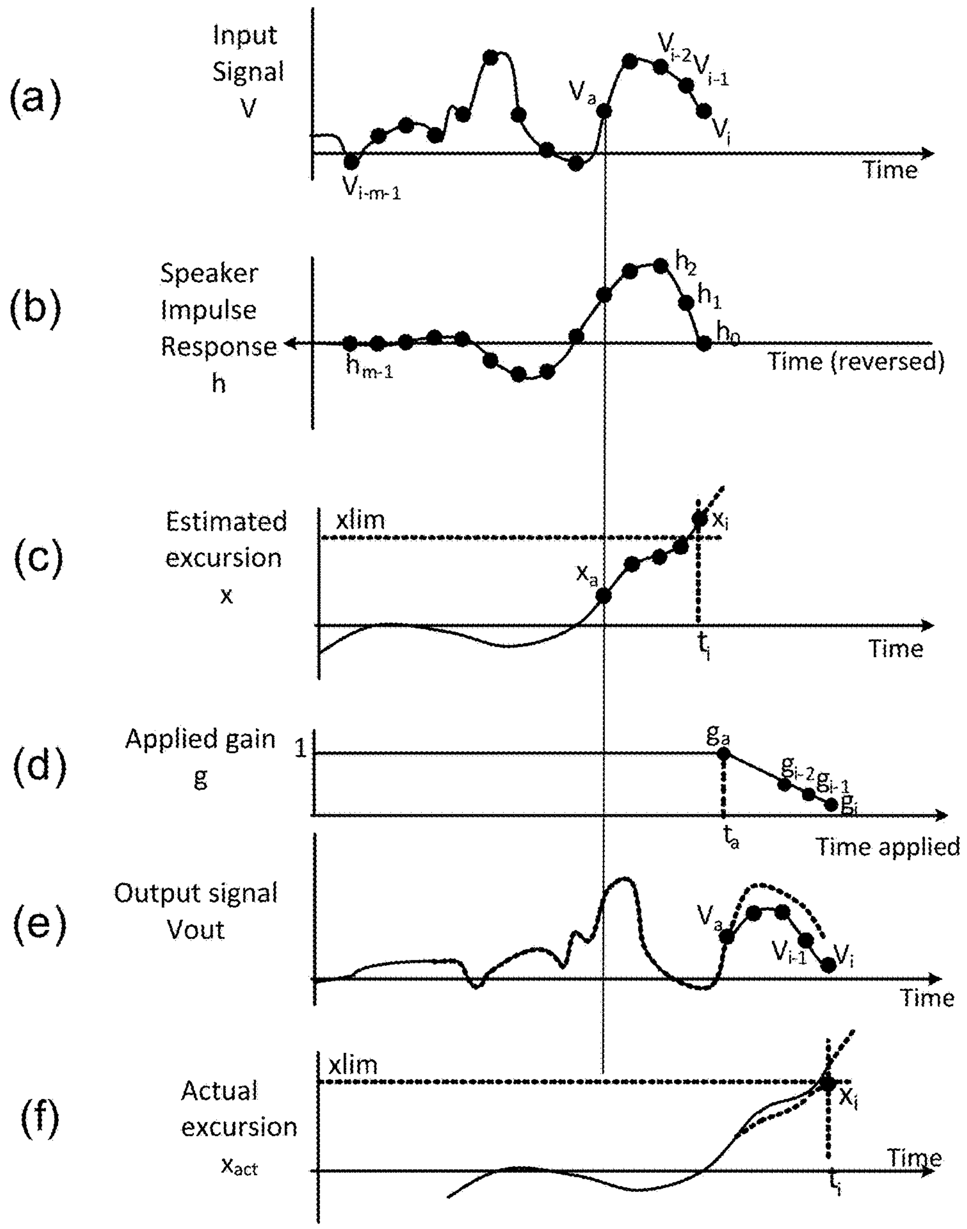
FIG. 3, plots (*a*)-(*f*), illustrate waveforms illustrating the operation of a speaker limiter as illustrated in FIG. 2.

FIG. 3 illustrates waveforms illustrating the operation of a speaker over excursion limiter block as illustrated in FIG. 2.

FIG. 3, plot (a) illustrates an input signal waveform V as applied to the input node IN of the speaker driver system. Though drawn as a continuous curve, this waveform may comprise a set of discrete digital samples $\{V_k\}$.

Based on these voltage samples $\{v_k\}$, excursion prediction block 12 generates a corresponding sequence $\{x_k\}$ of estimates over time of the excursion x of the speaker voice coil over time, as illustrated in FIG. 3, plot (c), again illustrated as a continuous curve, and in this case with only discrete excursion estimate samples $\{x_a \ldots x_i\}$ explicitly drawn for simplicity.

In this embodiment, the estimated excursion is calculated using the impulse response $\{h_k\}$ of the loudspeaker. At a time point $t_i$ defined by a time index i the predicted excursion xi is calculated by the convolution equation:

$$x_i = \sum_{k=-\infty}^{i} V_k \cdot h_{i-k} \tag{1}$$

This equation can be viewed as doing a point-by-point multiplication of the voltage and time-reversed impulse response and subsequently summing these terms. FIG. 3, plot (b) thus illustrates the impulse response in a time reversed fashion for ease.

In practice only a finite number of coefficients, say m, of the impulse response will be provided and used to calculate the predicted excursion. Ideally this number m should be enough to span all significant terms of the impulse response, i.e. to span the full settling time $t_{sf}$ of the speaker electro-mechanical response. FIG. 3, plot (a) illustrates a set of discrete samples $V_i$ to $V_{i-m}$ which may be used in conjunction with the m coefficients $h_0 \ldots h_{m-1}$ of the impulse response illustrated in FIG. 3, plot (b) to generate the single sample $x_i$ of the estimated excursion x illustrated in FIG. 3, plot (c).

In some embodiments, the excursion may be calculated by an excursion predictor block 12 which employs other types of calculation rather than the impulse response, for example some infinite-impulse response digital filter, with coefficients to determine the poles and zeros of the response.

In this example the input voltage waveform and modelled speaker characteristics are such that the excursion prediction block 12 first predicts an over-excursion relative to the defined excursion limit xlim at a time $t_i$. The "i" subscript is the time index when this first predicted over-excursion event occurs.

As illustrated in FIG. 2, the system comprises a delay or buffer 15, for instance a sequence of delay stages between the signal input node IN and the gain block 14. By running the pre-buffered audio samples V through the excursion predictor 12 the system will predict, before the delayed version Vd of the input signal V arrives at the gain block 14 or loudspeaker 10, that the excursion will exceed its limit xlim. Thus the buffer 15 will allow the system a time window in which the gain calculator 23 may calculate an appropriate gain reduction and in which the gain block 14 may apply such attenuation to the delayed audio samples Vd so that the actual excursion of the loudspeaker will remain within its limit xlim.

The gain calculator block 23 thus calculates a series of gain settings, $g_k$, i.e. a gain profile such as illustrated in plot (d) of FIG. 3, which will reduce the predicted excursion at time $t_i$ to its prescribed limit. Using Equation (1) we can mathematically state this constraint as:

$$x_{lim} = \sum_{k=-\infty}^{i} g_k \cdot V_k \cdot h_{i-k} \tag{2}$$

If the predicted excursions with and without gain adjustment are calculated by equations (2) and (1) respectively, and if gk is assumed to have a constant value G for all k, then xlim will be equal to G·xi, so a gain reduction by a factor equal to xlim/xi will be adequate to maintain xi equal to xlim. In practice, only a finite number, m, of points may be used to calculate xi, but provided m is large enough to span all significant values of the speaker impulse response, then a gain of xlim/xi will still be adequate to maintain the excursion within the predetermined limit. In other words were the excursion xi predicted (without any gain adjustment) in response to a new sample to exceed the predetermined limit, then by applying a gain reduction equal to xlim/xi to the m preceding samples the predicted excursion after gain limiting would remain within acceptable limits, provided that the set of preceding m samples is large enough.

However, in order to be able to apply the correct gain to input sample Vi-m−1 which occurred m sample periods earlier, the delay introduced by delay block 15 has to be at least m sample periods. Such a delay may be unacceptable in some applications. In some embodiments therefore a gain value or set of gain values may be calculated that may be applied to a set of successive samples that span a time period which is shorter than the settling time of the loudspeaker but which are sufficient to maintain the excursion within acceptable limits.

Thus assuming that only the last n samples $V_{i-n-1}$ to $V_i$ are still buffered in delay block 15 and available to be subjected to gain reduction, and that the nominal gain of the gain block 14 is unity, then effectively in equation (2) the gains $g_k$ for k=−∞ . . . i-n−1 should be taken as unity.

The gain calculator may thus determine a sequence of gains $\{g_a \ldots g_i\}$ that are applied to the samples $V_a$ to $V_i$ output from the delay block 15 so as to maintain the loudspeaker excursion within acceptable limits.

Figure 4:
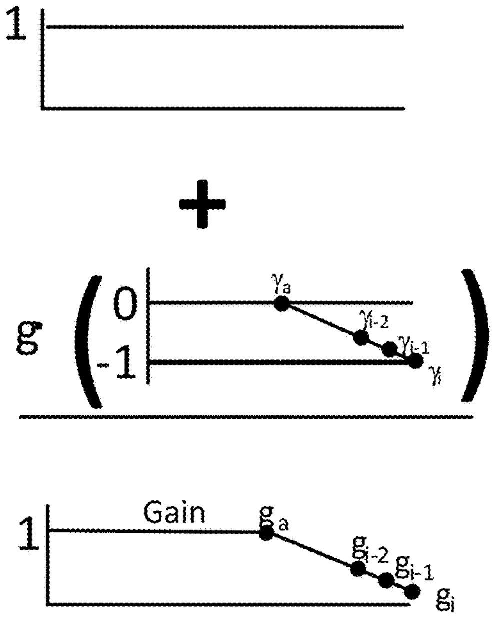
FIG. 4 illustrates one example of a gain profile.

In some embodiments, the sequence of gains $\{g_a \ldots g_i\}$ applied may be described in terms of a calculated gain adjustment factor G and a predefined gain profile sequence $\{y_k\}$ such that the sequence of applied gains is given by:

$$g_k = 1 + G \cdot y_k \tag{3}$$

Where $y_k$ may be non-zero over a range of k from i to a. For example, as illustrated in FIG. 4, $y_k$ may be given by $$\gamma_k - \begin{cases} 0 \text{ if } k < a \\ -\frac{k-a}{i-a} \text{ otherwise} \end{cases} \tag{4}$$

In this example $y_k$ is zero for k=a and −1 for k=i and ramps down linearly between these two values. The applied gain $\{g_k\}$ is thus unity until k=a, and then ramps down to 1−G by k=i.

With this decomposition there is now only one unknown parameter, G, and it is linearly related to the applied gains, $g_k$. This allows us to solve for G. Substituting (3) into (2) yields:

$$x_{lim} = \sum_{k=-\infty}^{i} (1 + G \cdot \gamma_k) \cdot V_k \cdot h_{i-k} \tag{5}$$

However this expression may be simplified considering (4):

$$x_{lim} = \sum_{k=-\infty}^{i} V_k \cdot h_{i-k} + G \sum_{k=a}^{i} \gamma_k \cdot V_k \cdot h_{i-k} \tag{6}$$

Finally the term on the left may be recognized as the previously calculated over excursion value $x_i$ from equation (1). Substituting and solving for the gain yields:

$$G = \frac{x_{lim} - x_i}{\sum_{k=a}^{i} (V_k \cdot \gamma_k) \cdot h_{i-k}} \tag{7}$$

It can be seen that a value G is calculated as a general gain factor for a gain profile to be applied to a finite set of the n preceding samples, where the set of samples may have any desired length and may in particular be shorter than the settling response time of the loudspeaker.

The solution given in (7) may also be extended to gain profiles other than the ramp shown in FIG. 4. If $y_k$ is set to −1, or some other constant value, for a<k<i then a simple step change in gain will be implemented. An S-curve, or any other profile may be used provided that it may be expressed in the form of equation (3). The only difference is that a new $y_k$ will need to be defined instead of that defined in equation (4).

Note that for the case of a step change ($y_k$ set to −1) and for an infinitely long buffer, i.e. a=i−n−1=−∞, the denominator of equation (7) becomes equal to $x_i$, so G becomes (xlim/xi)−1 and the applied gain becomes xlim/xi. Provided that n is large enough to encompass all the substantially non-zero terms of the speaker impulse response, the denominator will still be substantially equal to xi and the applied gain necessary to avoid over-excursion will be equal to xlim/xi. Conversely applying the steady-state gain factor xlim/xi as in the scheme illustrated in FIG. 1 will be adequate to avoid over-excursion.

However for smaller values of n, i.e. for smaller ranges from a to i over which gain adjustment is applied, the denominator will generally be smaller and hence G necessary to avoid over-excursion will be larger in magnitude, i.e. the gain adjustment will need to be more severe. Just applying a gain of xlim/xi will not be sufficient. In other words, applying just this steady-stage gain xlim/xi will not be adequate unless the signal can be corrected over a sequence of signal values at least as long as the significantly non-zero portion of the speaker impulse response, i.e. the speaker settling time $t_s$.

In order to be able to apply the gain adjustment to such a long sequence of signal values, this sequence of values will need to be stored in the buffer 15, so the signal delay d though the buffer 15 must be at least as long as the speaker response settling time $t_s$. Providing such a long buffer 15 may be undesirable in terms of the extra hardware and memory requirements required. Also in some applications a signal delay d as prolonged as $t_s$ is undesirable, for instance in telephony, particularly in speakerphone applications. The small extra computational effort required to perform the above gain factor calculations may thus be worthwhile.

FIG. 3(*d*) thus illustrates the calculated gain settings determined as described above. FIG. 3(*e*) illustrates the delayed and gain-adjusted waveform Vout actually applied to the speaker 10 compared to that of the non-gain adjusted non delayed input signal V waveform of FIG. 3, plot (a) and FIG. 3, plot (f) illustrates the corresponding actual excursion waveform with and without the gain adjustment. The former may be seen to have successfully limited excursion so that xi is reduced to xlim.

The buffer 15 is thus sufficient to apply a delay sufficient for the n sample $V_a$ to $V_i$. In addition to allow for signal propagation and processing of the signals in the excursions predictor and gain calculator path there may be some additional delay to allow for synchronisation. However the delay implemented by the buffer may be shorter than the settling time of the loudspeaker impulse response.

It will be appreciated that the set of gains calculated ($g_a \ldots g_i$) should be applied to samples $V_a$ to $V_i$ output from the buffer or delay block 15. The gain settings may therefore be stored in a gain buffer 24 with the gain buffer being designed with respect to the delay block 15 and the processing delays inherent in the excursion predictor 12 and gain calculator 23 so that the gain settings are applied to the appropriate set of samples. The set of samples of the delayed audio signal comprises the sample corresponding to the most recent sample on which the excursion prediction was made, i.e. $V_i$, and a plurality of preceding samples, i.e. the samples through to $V_a$. The gain buffer 24 may therefore be arranged such that gain setting $g_a$ is synchronised with the sample $V_a$ at the gain element 14. The gain buffer, or similar synchronisation control, may form part of the gain controller in practice and is illustrated separately in FIG. 2 for clarity.

Figure 5:
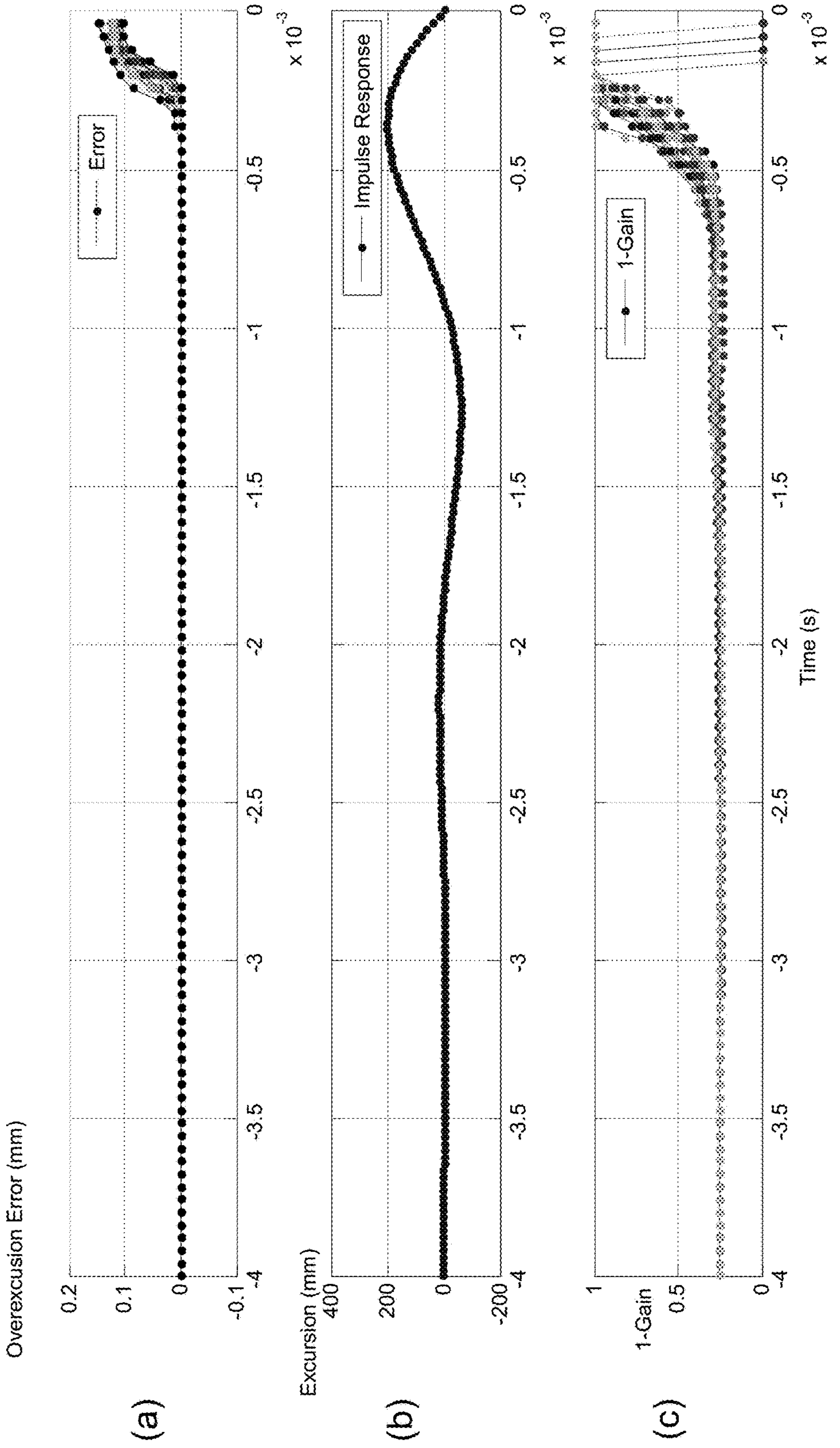
FIG. 5, plots (*a*)-(*c*), illustrate plots showing how excursion error and gain settings vary with the time over which the gain change is applied for a system according an embodiment of the invention that implements a step change in gain.

FIG. 5, plots (*a*)-(*c*) illustrate the advantageous reduction in signal delay made possible by employing a speaker driver system similar to that illustrated in FIG. 2, with the gain profile set to give a step change in applied gain. To generate these plots, the buffer delay d was varied from near zero to about 4 ms and the maximum over-excursion and calculated gain adjustment factor G plotted versus the buffer delay. The multiple overlaid curves are the results of applying different input waveforms each with a similar potential over-excursion.

FIG. 5, plot (a) illustrates the resulting over-excursion, which can be seen to be zero except for buffer delays smaller than about 300 μs. In other words as long at the buffer had a delay of at least 300 μs then calculating and applying the gain reductions a described above was sufficient to prevent over-excursion. This minimum buffer length compares favourably with the settling time of the time-reversed speaker impulse response shown in FIG. 5, plot (b). FIG. 5, plot (c) shows the gain adjustment factor G. For long buffer delays this factor converges to about 0.25, corresponding to the gain of (1−0.25)=0.75 that would be applied by a conventional system. For shorter buffer delays, since the gain will be applied to fewer samples, a more drastic gain reduction is required, until at about 300 μs the calculated gain adjustment factor G becomes unity, corresponding to an actual applied gain of zero. Further reduction in the buffer delay causes the system to fail to prevent significant over-excursion.

Figure 6:
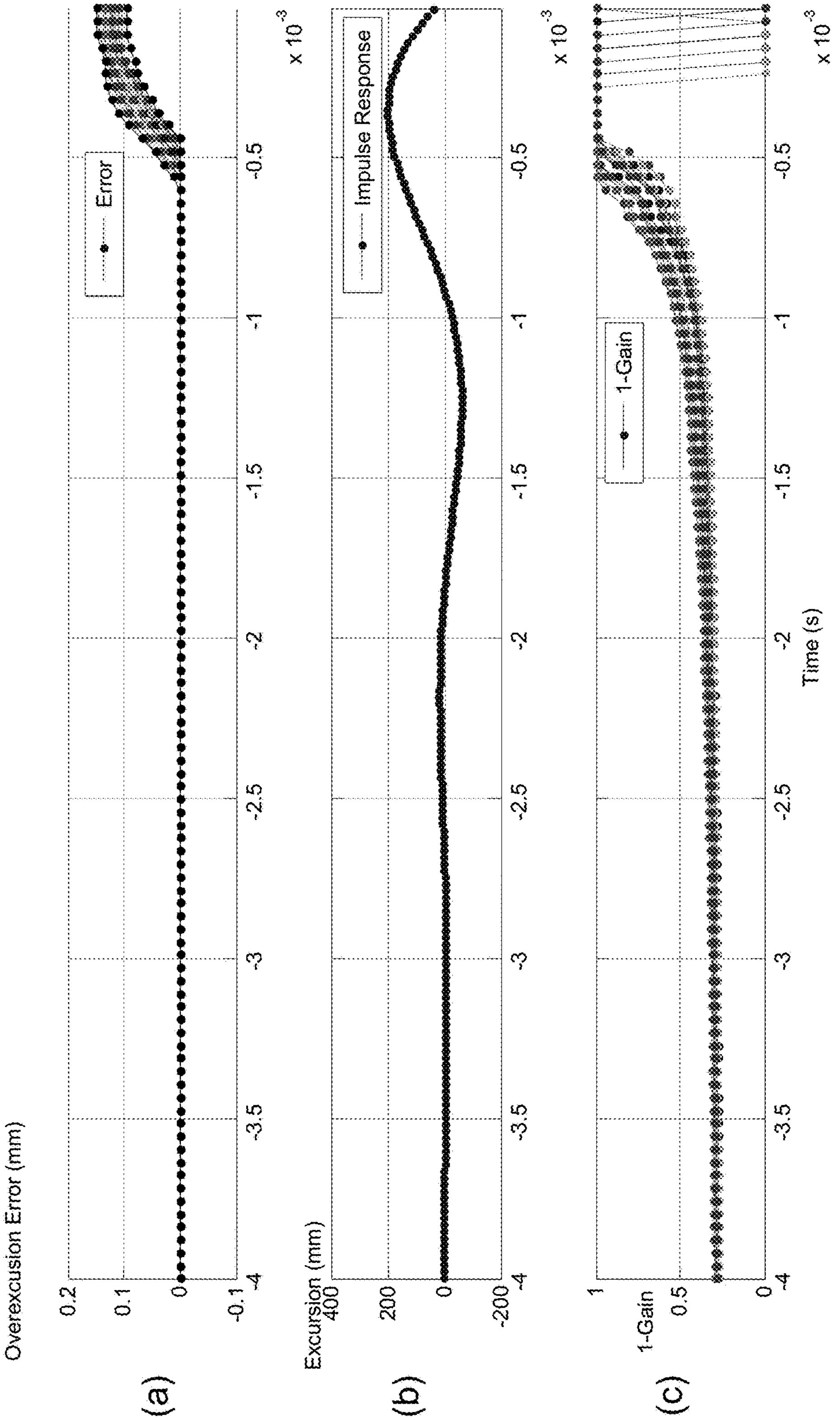
FIG. 6, plots (*a*)-(*c*), illustrate plots similar to those of FIG. 5 for an embodiment that implements a ramped gain profile.

FIG. 6 illustrates similar plots to those illustrated in FIG. 5 but this time shows the results of using a linear ramp gain profile (rather than step change used for the plots of FIG. 5). Since the full gain adjustment G is not applied over the full range of delay, a larger value of G is required, and the system starts to fail at a longer delay of about 600 μs.

Figure 7:
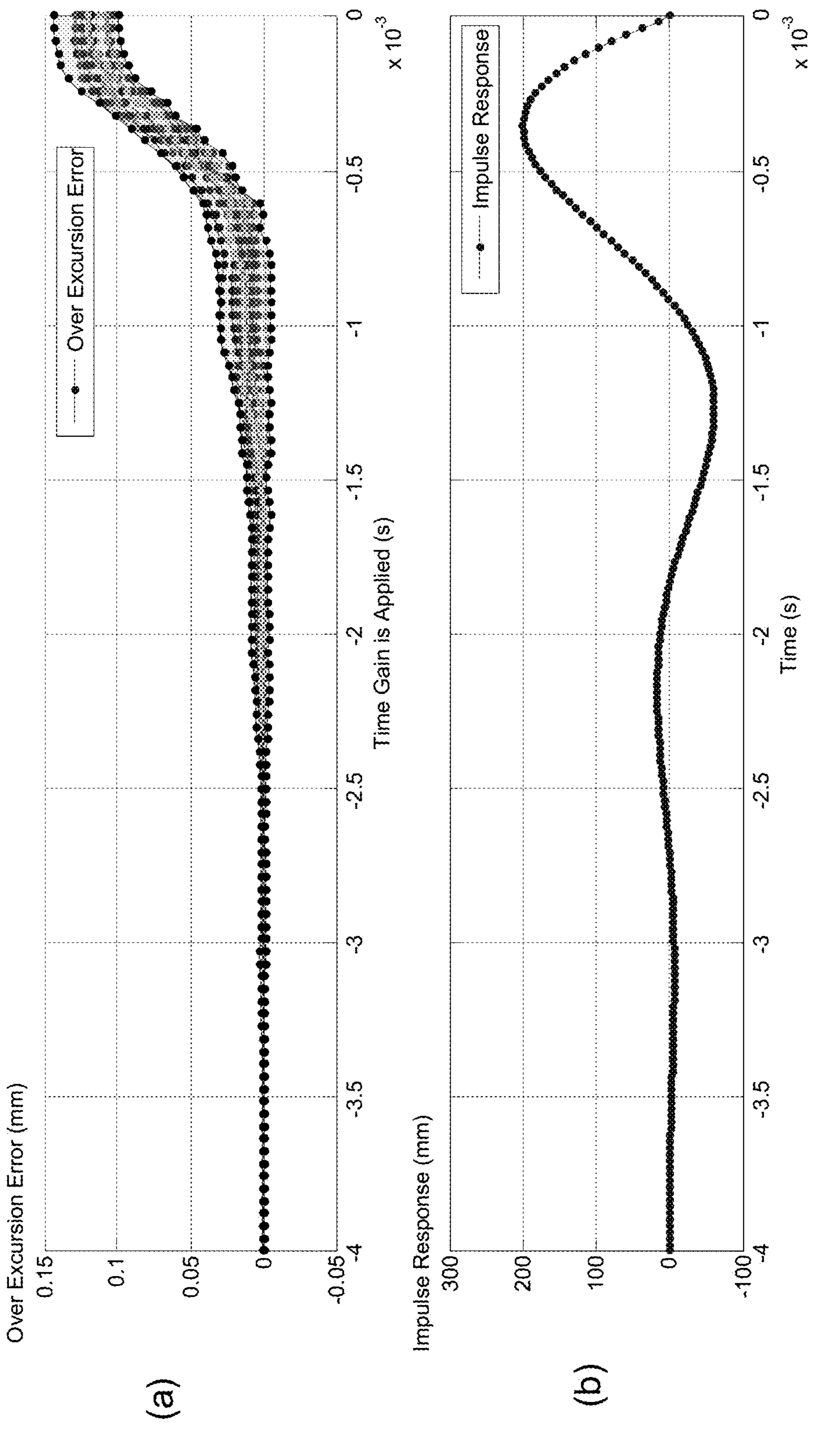
FIG. 7, plots (*a*) and (*b*), illustrate how excursion error varies with the time over which the gain change is applied for a conventional excursion protection system.

FIG. 7 illustrates the results of a conventional system, where a gain of xlim/xi is applied. In other words FIG. 7 illustrates the effect of varying buffer size on a conventional system where the gain setting is controlled to the xlim/xi.

It can be seen that the conventional system requires a much longer minimum delay of around 3 ms, of the order of the settling time of the speaker impulse response. For buffer delays of less than about 3 ms the system is not capable of preventing over-excursion.

Figure 8:
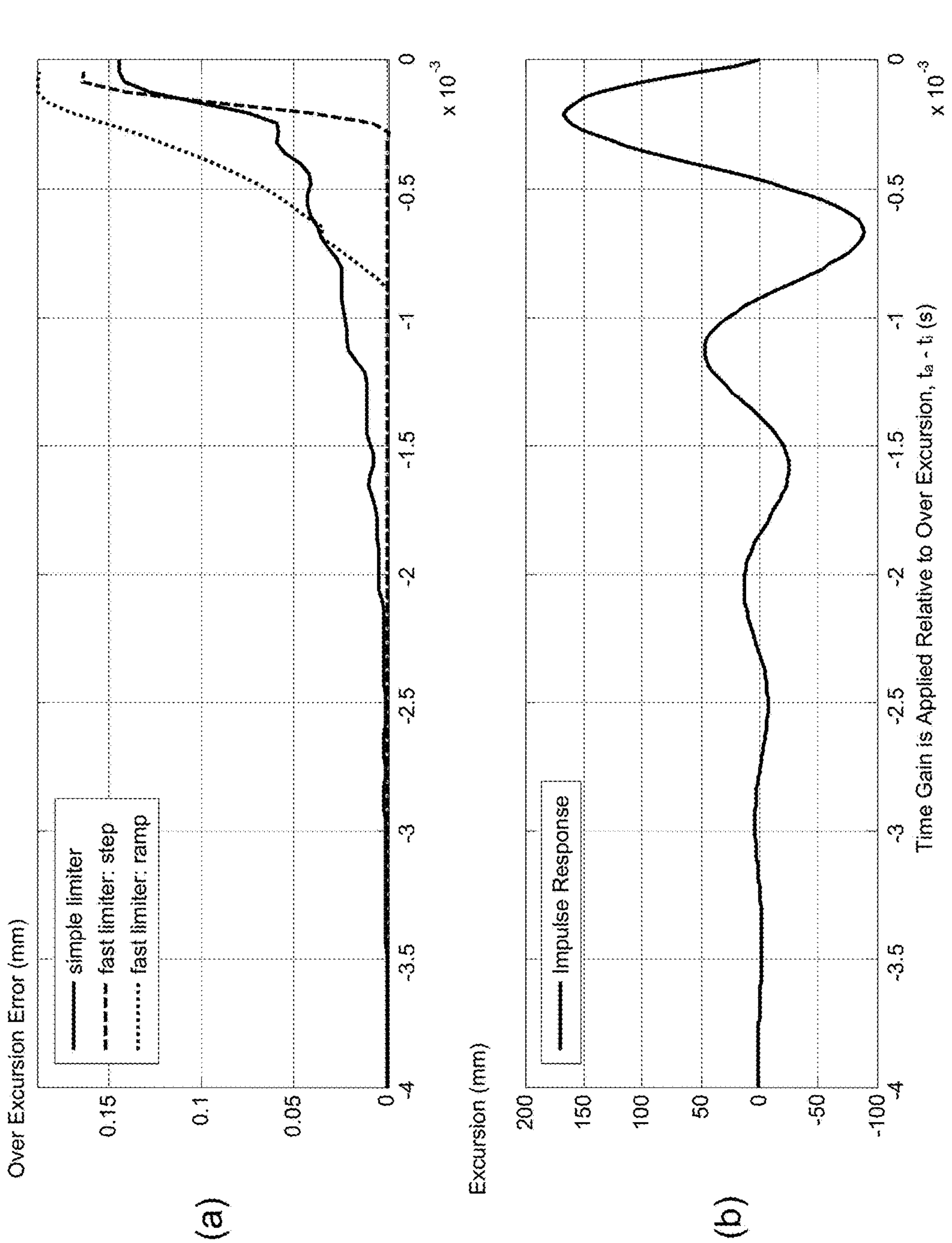
FIG. 8, plots (*a*) and (*b*), illustrate a comparison of the excursion error versus time duration of FIGS. 5 to 7 and how it compares with impulse response time.

FIG. 8 summarises the results illustrated in FIGS. 5 to 7, illustrating the advantages of the fast limiter, i.e. a system as per the embodiments disclosed herein that can operate with a reduced buffer delay, over the simple limiter. Similar to FIGS. 5 to 7 the top plot shows over excursion error versus the time-span over which the gain profile is applied. The fast limiter results using both step and ramp profiles are shown.

The simple limiter results are overlaid for comparison. The bottom plot (b) is the system impulse response. Note that with both step and ramp profiles the fast limiter is able to maintain zero over-excursion error over a larger range of start times than the simple limiter. More specifically the gain profile of the fast limiter can be initiated much closer to the over excursion event. Therefore the fast limiter can be advantageously used with a much shorter delay buffer 15 than the simple limiter.

In embodiments therefore the gain controller may thus determine at least one gain setting to be applied to a set of successive samples of the delayed audio signal where the time-span of the set of samples, i.e. the duration of the set, is less than a first duration which corresponds to an impulse response settling time of the loudspeaker. The settling response impulse time or the first duration may be seen as the duration of the first two lobes of impulse response, or the time taken for an impulse response envelope to decay to 5% of its peak value. The settling time/first duration could be the time taken for a step response to settle to 1%.

The delay time of the delay block 15, i.e. the length of the buffer may thus be less than the first duration/impulse response settling time of the loudspeaker.

The time-span of the set of samples may for instance be in the range of 80% to 15% (inclusive) of the impulse response settling time of the loudspeaker. For instance the time-span may be not greater than 50% of the impulse response settling time of the loudspeaker.

Likewise the delay time for the loudspeaker may be n the range of 80% to 15% (inclusive) of the impulse response settling time of the loudspeaker and in some embodiments may be equal to or lower than 50% of the impulse response settling time of the loudspeaker.

In some embodiments, for the type of loudspeakers envisaged for the results of FIG. 8, this may mean that the time delay of the delay block and/or time-span of the set of samples may be less than or equal to 2 ms, or less than or equal to 1 ms or less than or equal to 500 μs. For other types of loudspeaker however different time delays may be appropriate.

The advantages of the above described fast limiter include the following:

- it allows more flexibility in the choice of the delay of the system (i.e. the size of the buffer 15). As shown in FIG. 8, the chosen gain profile of the fast limiter can be applied later than what the simple limiter would allow to avoid over-excursion events. This flexibility can be important when latency constraints are stringent and the decay of the impulse response of the speaker exceeds such requirements;
- the gain profile used by the fast limiter can be chosen from a variety of different types since it has been clearly shown that the concept of fast limiting to prevent over excursion can be extended to gain profiles that are different from the step profile. To reduce distortion and allow smoother gain transitions when over-excursion is predicted, more appropriate profiles can be used such as linear ramps or S-shaped curves for example.

While the gain profile {gk} curves may define an attack time of the fast limiter, for example in terms of the ramp or s-shape duration, in some embodiments the gain calculator may continue to: hold the final reduced gain value for some extra number of samples; apply only a gradual gain recovery back to unity; or also implement and define a hold time and/or release times or release characteristic. These gains may be overridden should a later signal cause an over-excursion to be predicted. The profile and duration of the gain release can be selected to minimise any audible artefacts for example in the presence of repetitive or persistent overload conditions.

Figure 9:
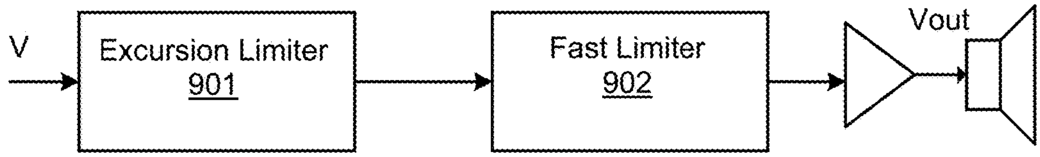
FIG. 9 illustrates an apparatus having an excursion limiter according to an embodiment preceded by another excursion limiter.

It should be noted that the fast limiter as disclosed herein, e.g. the speaker protection block of FIG. 2, may be used in combination with other types of excursion limiters. For example as illustrated in FIG. 9 a first excursion limiter 901 may be used before a fast excursion limiter 902, which may be an excursion limiter according to the embodiments described above, e.g. speaker protection block 100. The fast excursion limiter 902 is thus a second limiter located downstream of the first limiter 901. The first limiter 901 could be designed to meet some specific system requirements (e.g. latency, MIPS, memory . . . ) or some performance requirements (e.g. loudness, frequency response . . . ). However in order to meet such requirements, the first limiter 901 may not be able to guarantee complete excursion protection (e.g. reduced latency could cause excursion overshoots similar to those shown in FIG. 8 for the simple limiter), but it may still attenuate excursion effectively enough to cover most of the potential over-excursion events. In this case, the fast limiter 902 may be applied after limiter 901 to catch any residual overshoots that passed through the first limiting stage. With limited additional delay and minimal audible impact (given by the chosen curve applied to the gain profile), limiter 902 can guarantee full protection and reduce only the remaining excursion peaks that could damage the speaker.

Figure 10:
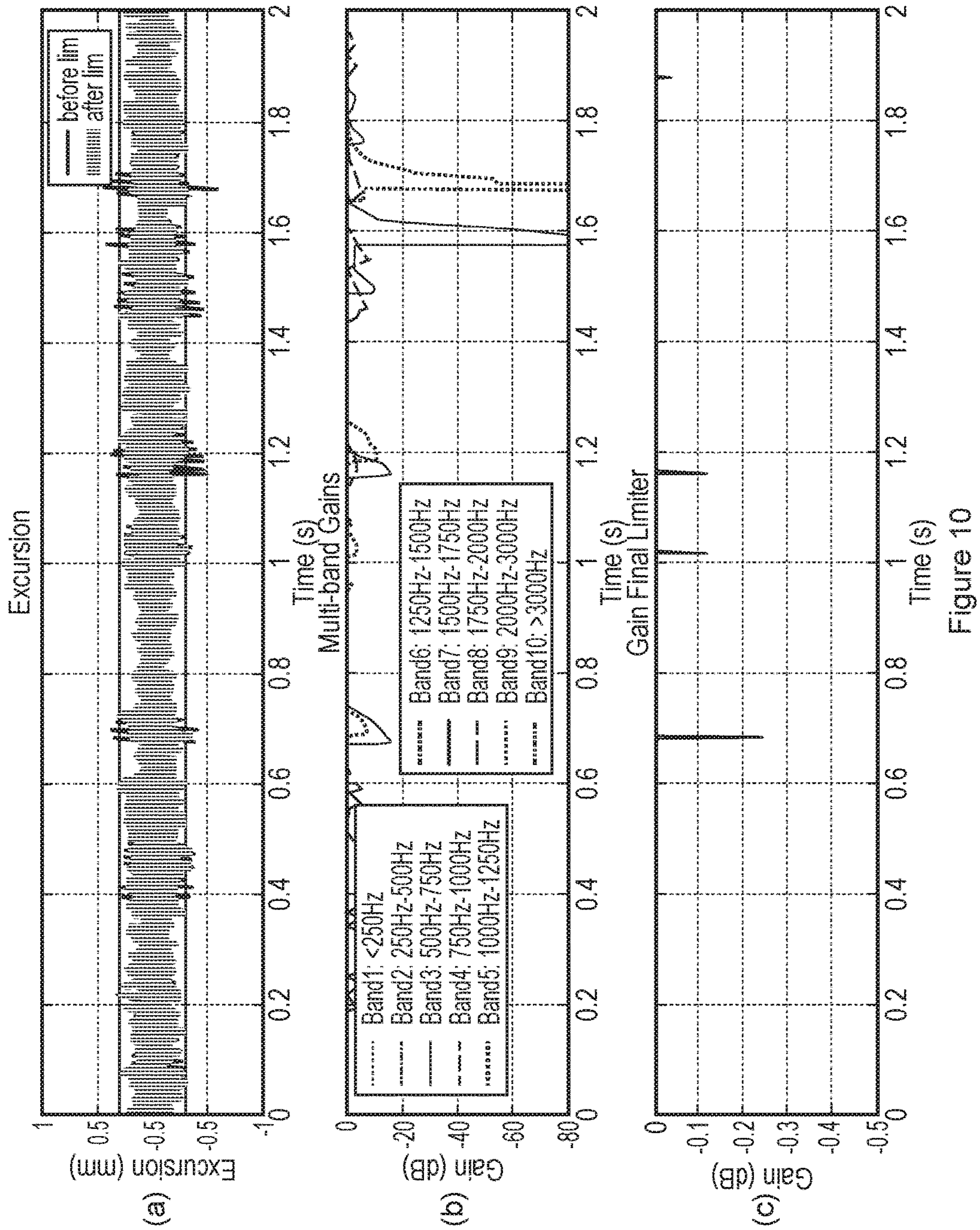
FIG. 10 illustrates plots of the operation of an apparatus such as illustrated in FIG. 9.

FIG. 10 shows an example of the combined behaviour of a first limiter followed by a fast limiter such as illustrated in FIG. 9. FIG. 10, plot (a) illustrates the excursion with and without the excursion limiting. FIG. 10, plot (b) illustrates the gain adjustment applied by the first limiter 901, which in this case is a multi-band limiter that applies excursion limiting to different frequency bands of the audio signal and so the gain adjustments for each band are illustrated. FIG. 10, plot (c) illustrates the gain adjustment applied by the fast limiter i.e. limiter 902.

It can be seen that the multi-band limiter is often active in attenuating excursion peaks and effectively reduces the great majority of excursion peaks bringing them down to the safe level. The fast limiter (bottom plot) intervenes relatively infrequently, and with small gain adjustments, to further reduce the samples that would cause excessive excursion. In various embodiments comprising a plurality of cascaded limiters design choices may be made to trade-off the relative reliance on each limiter.

The above description describes how a potential over-excursion at a time index i may be prevented by applying a gain reduction to a set of n preceding signal samples. Despite this gain reduction, it may still be the case that the next signal sample may be such that a potential over-excursion may occur at the next time point. In such a case a similar calculation and gain adjustment may be applied to the respective set of n immediately preceding samples, i.e. to a set of samples displaced by one sample period in time, and any overlapping gain values simply over-written, or preferably the minimum value applicable to each gain coefficient may be used. Over-excursion protection will still be effective at each time point.

Figure 11:
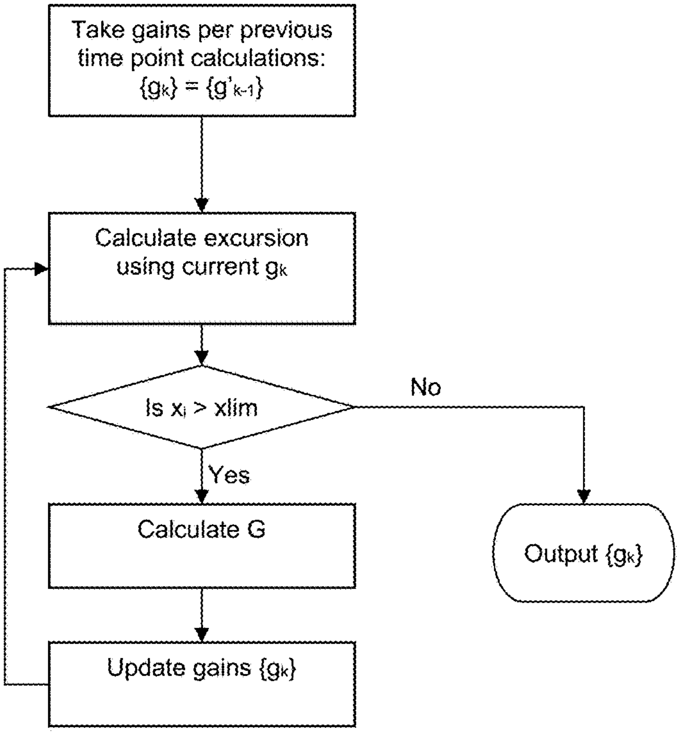
FIG. 11 illustrates a flow chart for calculating a gain adjustment factor according to one example.

As illustrated in FIG. 11, in some embodiments, the excursion calculation at each time point may be adjusted to take account of the gain reductions already prescribed. In other words, for each time point the excursion $x_i$ is initially calculated using a set of values for gain $\{1+g_k\}$ calculated at the previous time point, possibly including some hold time or decay dynamics applied to the gain values. If this newly calculated excursion for the current time point is less than xlim, then this set of gains is retained. If not then a new value of G is calculated, along with corresponding revised gain values $\{1+G \cdot y_k\}$ and the excursion is recalculated. This loop may be iterated until a satisfactory solution is found, as illustrated in the flow diagram of FIG. 11.

In further embodiments, the gain control calculations may be modified to control both the position and the velocity of the speaker coil. The added velocity constraint may increase the robustness of the algorithm. With only a position constraint, it is possible that the excursion immediately before or after the constrained point may exceed the threshold. However, with an added velocity constraint, the excursion limiter may locally control the slope, i.e. rate of change, of the excursion verses time. For example, consider that a gain profile is chosen to force the excursion of a given point to be at the excursion limit. If the slope is simultaneously forced to be positive, points immediately before this point must have a smaller excursion, and therefore remain in the limit. If instead the slope is forced to be zero, points immediately before and after this point will remain at the limit. In this way a velocity constraint may be used to increase robustness.

The fast limiter as described in any of the variants above may be extended to include a velocity constraint. To accomplish this it will be necessary to use at least two gain profiles, $g_k^1$ and $g_k^2$, along with the corresponding sequences $y_k^1$ and $y_k^2$ as defined in (3) and (4). Two gain profiles are sufficient for velocity but additional profiles could be used if desired, e.g. to extend to acceleration or higher derivatives.

The final gain profile, $g_k$, will be a weighted sum of these two gain profiles:

$$g_k = 1 + g_1 \cdot y_k^1 + g_2 \cdot y_k^2 \tag{8}$$

The scalar constants $g_1$ and $g_2$ are used to construct the final gain profile, $g_k$, in a manner similar to (3).

The methods used to derive (5) through (7) are re-applied, but now include a second set of linear equations for velocity. The result is that (7) is transformed into a vector equation:

$$\begin{bmatrix} x_i - x_{lim} \\ v_i - v_i^f \end{bmatrix} = \begin{bmatrix} \sum_{k=a}^{i} (V_k \cdot \gamma_k^1) \cdot h_{i-k} & \sum_{k=a}^{i} (V_k \cdot \gamma_k^2) \cdot h_{i-k} \\ \sum_{k=a}^{i} (V_k \cdot \gamma_k^1) \cdot r_{i-k} & \sum_{k=a}^{i} (V_k \cdot \gamma_k^2) \cdot r_{i-k} \end{bmatrix} \cdot \begin{bmatrix} g_1 \\ g_2 \end{bmatrix} \tag{9}$$

Where $v_i$ is the initial velocity at time "i", $v_i^f$ is the final desired velocity at time "i", and $r_{i-k}$ is the impulse response of the velocity. All other variables in (9) are as they were defined in (7).

Note that (9) is a vector equation that must be simultaneously solved for $g_1$ and $g_2$. The results are then substituted into (8) to derive the final gain sequence.

In some embodiments, particularly for use without any preceding excursion limiter, it may be desirable to implement a multi-band form of the limiter, i.e. to be able to apply different gains to components of the signal which fall into different frequency bands. These frequency bands may be linearly spaced or logarithmically defined or defined in some other way for example mel frequency bands.

The input signal V may be regarded as the superposition of many signals, say M signals:

$$v[n] = \sum_{m=0}^{M-1} v_m[n]$$

Assuming linearity, the excursion prediction block may calculate an estimate for the total excursion at a given time point as a summation of the respective excursion components for each signal component:

$$x[n] = \sum_{m=0}^{M-1} x_m[n] = \sum_{m=0}^{M-1} \sum_{i=0}^{\infty} v_m[n-i] * h[i]$$

If |x[n]|>Xlim, then an over-excursion has been predicted and a gain reduction needs to be applied to a range of signal samples.

Similarly to the single-band case disclosed above, the condition for limiting the total excursion to xlim may be expressed as:

$$x_{lim} = \sum_{m=0}^{M-1} \sum_{i=0}^{\infty} v_m[n-i] h[i] g_m[i]$$

where:

$$g_m[i] = (1 - G_m \gamma_m[i])$$

In some embodiments the ramping function may be the same for all bands. In other embodiments, each frequency band indexed m may have an independent ramping function or gain profile {gm[i]}.

The equation may be simplified by substitution thus:

$$x_{lim} = x[n] - \sum_{m=0}^{M-1} G_m \sum_{i=0}^{K_m} v_m[n-i]h[i]\gamma_m[i]$$

Whereas in the single band case there was a single G to solve for to provide the gain reduction value, there are now m values to solve for. This is an underdetermined problem, and embodiments may add various other constraints to determine the relative gain adjustments to be defined by the gain calculation block in different bands.

In some embodiments the relative gains may be derived so as to minimise the magnitude sum |Gm|, i.e. to minimise the overall gain reduction, may be minimised. For example initially assume all Gm=0 (no gain reduction) except for the band, say band index q, with the largest excursion, and solve for Gq explicitly using $$x_{lim} - x[n] = -G_q \sum_{i=0}^{K_q} v_q[n-i]h[i]\gamma_q[i]$$

If Gq<1 then this gain reduction is enough to limit the excursion. If Gq>1 set Gq to unity to give the maximum attenuation possible in that frequency band q, and move on to perform a similar calculation for the band with the next largest excursion, and continue until the excursion limit has been realised. If Gm<0 for any frequency band set it to zero. Other optimisation criteria and methods [as per sister multiband excursion limit case] are possible.

In some embodiments, the signal samples may be processed in frames, for example of 16 samples per frame.

In some embodiments the gains may be calculated at every audio sample period, e.g. at 48 ks/s. In other embodiments the gains may be calculated only once per frame of say 16 samples. In such cases the excursion value used to calculate the required gain reduction may be the maximum of the magnitudes of the estimated excursions for the current frame.

In some embodiments at least some of parameters of the speaker protection block may be configurable differently according to a user's use case. For example a longer signal delay may be permissible in music play-back use, with potentially high-quality source material, allowing less aggressive attack times for the gain modulation and less consequent manipulation of the original signal. On the other hand, for phone voice calls especially speakerphone-mode calls for example the delay may preferably be reduced to meet a lower latency budget. The parameters may therefore be configurable either by a user or automatically. In some embodiments the parameters may be configurable in use, for instance a user could select certain parameters according to the their preference and/or defined sets of parameters could be selected based on the use, for instance an apps processor or the like could determine whether a media file is being played or whether voice call data is being relayed and configure speaker protection accordingly.

The excursion prediction block 12 may calculate the excursion or displacement based on the coefficients of a stored impulse response. Alternatively some other model, for example a Thiele-Small Model may be used as the basis of calculations. In either case, the coefficients of the displacement model may be fixed, maybe by initial design on the basis of some initial characterisation from pilot builds, or by a one-time calibration during manufacturing. The coefficients may be adapted during use on the basis of parameter estimates from the voltage and current waveforms in the load, and possibly modified in use based on a detection of temperature of the voice coil or some other part of the speaker or host device or of the ambient temperature.

While the speaker mechanism and its excursion have been referred to as a voice coil, this does not imply that the speaker need comprise a cylindrical coil—other geometries of coil and magnetic components may be employed. The speaker mechanism may employ other means that the electromagnetic effect of a coil acting on a permanent magnet. Indeed the general method is applicable to other transducers, for instance electrostatic, where a mechanical excursion requires being limited. The method may also be applicable to limiting of other physical variables associated with a speaker. Although described in terms of the excursion of a loudspeaker cone, the invention is applicable to many types of audio output transducer. Applicable transducers may comprise various types of mechanical member of various geometries whose movement requires to be constrained to prevent damage or degradation over time, and may include motor elements other than electromagnetic coils, for example piezo-electric drivers. Embodiments may be used to process other signals than conventional audio signals (20 hz-20 khz), for example ultrasonic signals, haptic stimulus signals, sub-audio signals and for the purposes of this disclosure such signals are considered as "audio signals". In such cases the system may be adapted for use by substituting an appropriate excursion response function.

In some embodiments the gain calculation circuitry may be temporarily disabled, for example the clocks may be removed from some or all of the relevant circuitry, should it be detected that the power dissipated in the coil or the predicted excursion is well below some threshold. This may reduce computational overhead when not required and reduce power consumption.

The protection circuitry described above may be incorporated in audio amplifier circuitry in portable battery-powered devices such as mobile phones, tablets or lap-top computers or suchlike. It may also be used in speaker-phones, mains-powered music or PA amplifiers, audio amplifiers in automobiles and other transport apparatus.

Embodiments of the invention thus provide a speaker protection system that determines a speaker excursion based on an input signal tapped before a delay block so as to control gain settings applied to the samples output from the delay block. In embodiments the gain of a set of samples is controlled where the set of samples includes a sample corresponding to the most recent sample used in the excursion prediction and a plurality of preceding samples. The time-span of this set of samples may be less than a first duration corresponding to the impulse response settling time of the loudspeaker being driven. This means that the time delay of the delay block may also be less than this duration. The gains may be calculated taking the impulse response of the loudspeaker into account.

It will be noted that the calculated gain settings applied to just this set of samples is sufficient to maintain the excursion of the loudspeaker within an acceptable limit. In other words it is not necessary to control the gain of any samples preceding this set in order to limit the currently predicted excursion. Thus in the event that a gain reduction is required to limit a currently predicted excursion the gain reduction will only occur within the set of samples. It will be appreciated that earlier samples will of course have been subjected to gain control but the gain settings applied to such earlier samples will have been determine based on earlier excursion estimates.

Embodiments also relate to a speaker protection system that determines a speaker excursion based on an input signal tapped before a delay block so as to control gain settings applied to the samples output from the delay block in which the gain of a set of samples is controlled based on the impulse response of loudspeaker.

Figure 12:
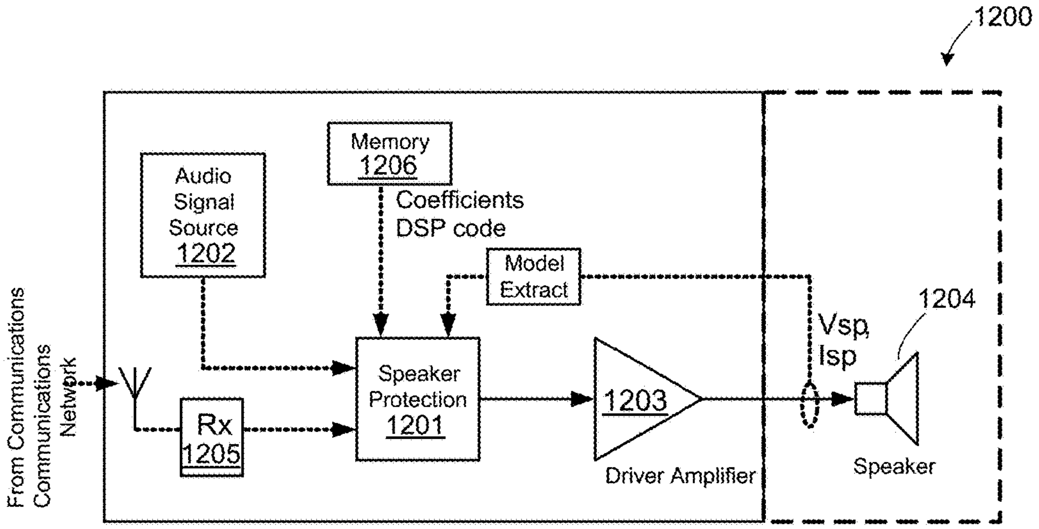
FIG. 12 illustrates an example of an apparatus having a speaker protection system.

FIG. 12 illustrates an embodiment of an apparatus 1200 incorporating the speaker protection system according to the present invention.

The apparatus, for example a mobile phone or tablet, comprises the speaker protection system 1201, which may be a system as described in any of the embodiments above. The speaker protection system 1201 is arranged to receive an audio signal either from an internal signal source 1202 or an external source.

An internal signal source 1202 may comprise a memory, e.g. a solid state memory, arranged to store media with an audio component, such as music or video, for playback via the speaker protection system 1201 and drive amplifier 1203 and finally at least one speaker 1204, which may be an internal speaker of the device or may be part of a peripheral apparatus which is connected to the apparatus in use.

An external source may comprise a communications network such as those used for mobile and wireless communications wherein the apparatus has a receiver 1205 to receive a voice call or media file for playback via the speaker protection system 1201 and drive amplifier 1203 and finally at least one speaker 1204.

It will be appreciated by those skilled in the art that during a voice call there are timing and latency requirements that are beyond the control of the apparatus. Thus as mentioned previously any signal processing in the signal path between the receiver 1205 and speaker 1204 should not introduce any significant delay. As mentioned previously the embodiments described above provide speaker protection that introduces only relatively low delays which will typically be within any allowable latency limits.

The speaker protection system 1201 may receive one or more feedback signals from the speaker for directly determining the displacement of the speaker itself and that are used to set the parameters of the displacement model within speaker protection system. Such feedback signals may, for example comprise current and/or voltage signals.

In some embodiments the speaker protection system may receive one or more pre-programmed signals relating to operation of the speaker protection system. Such signals may be based on data, settings or code that is internally stored, for example in a memory 1206. Such settings or data may be stored during manufacturing or during use in a calibration routine, e.g. as performed periodically or on power-up or reset. Such signals may be used to set at least some parameters of the speaker protection, such as attack or decay constant to be applied to gain changes etc., or data regarding the displacement model within the speaker protection system.

It will of course be appreciated that various embodiments of speaker protection block as disclosed or various blocks or parts thereof may be co-integrated with other blocks or parts thereof or with other functions of a host device on an integrated circuit such as a Smart Codec.

The skilled person will thus recognise that some aspects of the above-described apparatus and methods, for example the calculations performed by the processor may be embodied as processor control code, for example on a non-volatile carrier medium such as a disk, CD- or DVD-ROM, programmed memory such as read only memory (Firmware), or on a data carrier such as an optical or electrical signal carrier. For many applications embodiments of the invention will be implemented on a DSP (Digital Signal Processor), ASIC (Application Specific Integrated Circuit) or FPGA (Field Programmable Gate Array). Thus the code may comprise conventional program code or microcode or, for example code for setting up or controlling an ASIC or FPGA. The code may also comprise code for dynamically configuring re-configurable apparatus such as re-programmable logic gate arrays. Similarly the code may comprise code for a hardware description language such as Verilog™ or VHDL (Very high speed integrated circuit Hardware Description Language). As the skilled person will appreciate, the code may be distributed between a plurality of coupled components in communication with one another. Where appropriate, the embodiments may also be implemented using code running on a field-(re)programmable analogue array or similar device in order to configure analogue hardware Embodiments of the invention may be arranged as part of an audio processing circuit, for instance an audio circuit which may be provided in a host device. A circuit according to an embodiment of the present invention may be implemented as an integrated circuit. One or more loudspeakers may be connected to the integrated circuit in use.

The embodiments described above have been described with reference to reproduction of audio signals in the audio band, e.g. for speaker phone applications. The principles are equally applicable however to output transducers operating in other frequency bands that operate on similar principles. As used in this specification therefore the terms audio shall be taken to cover a range of frequencies including ultrasonic and/or infrasonic frequency bands. The term loudspeaker shall be interpreted accordingly to refer to any similar type of output transducer including ultrasonic outputs transducers or haptic transducers for example. For the avoidance of doubt however in some embodiments the loudspeaker may particularly be a loudspeaker for reproducing audio signals that are in the normal audible band, e.g. in the range of say 20 Hz to 20 kHz.

Embodiments have also been described in terms of a digital input and digital gain adjustment. A digital implementation is preferred but the principles may be applied equally to at least some analogue elements. For instance a controlled analogue gain could be applied to a segment of an analogue audio and/or an analogue input signal could be received.

Embodiments may be implemented in a host device, especially a portable and/or battery powered host device such as a mobile telephone, an audio player, a video player, a PDA, a mobile computing platform such as a laptop computer or tablet and/or a games device for example. Embodiments of the invention may also be implemented wholly or partially in accessories attachable to a host device, for example in active speakers or headsets or the like.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single feature or other unit may fulfil the functions of several units recited in the claims. Any reference numerals or labels in the claims shall not be construed so as to limit their scope. Terms such as amplify or gain include possibly applying a scaling factor of less than unity to a signal.

The invention claimed is:

1. A loudspeaker protection system comprising:

an input node for receiving a digital audio signal comprising a plurality of samples;

a delay block for delaying the digital audio signal;

a gain block for applying a controlled gain to the delayed digital audio signal output from the delay block;

an excursion predictor configured to receive a version of the audio signal from the signal path upstream of the delay block and determine a predicted excursion for a loudspeaker based on the audio signal; and a gain controller for controlling a gain setting of the gain block in response to the predicted excursion and a first loudspeaker impulse response model and a predetermined excursion limit, wherein the gain controller is configured to determine at least one gain setting to be applied to a set of samples of the audio signal delayed by the delay block; and wherein said set of samples of the audio signal correspond to a time-span which is less than an impulse response settling time of the loudspeaker, wherein the impulse response settling time of the loudspeaker is the duration of the first two lobes of impulse response.

2. A loudspeaker protection system as claimed in claim 1 wherein said set of samples comprises a sample of the audio signal delayed by the delay block that corresponds to the most recent sample of the audio signal on which the relevant predicted excursion is based and a predetermined number of preceding samples.

3. A loudspeaker protection system as claimed in claim 1 wherein the excursion predictor is configured to determine a predicted excursion in response to each new sample of the audio signal.

4. A loudspeaker protection system as claimed in claim 3 wherein, in response to each predicted excursion the gain controller is configured to determine the at least one gain setting to be applied to a respective set of samples.

5. A loudspeaker protection system as claimed in any claim 1 wherein the gain controller is configured to determine a set of gain settings, the set of gain settings comprising a respective gain setting for each of the samples in said set.

6. A loudspeaker protection system as claimed in claim 5 wherein the gain controller is configured to determine the set of gain settings according to a gain profile.

7. A loudspeaker protection system as claimed in claim 1 wherein the first loudspeaker impulse response model comprises a first series of impulse response coefficients.

8. A loudspeaker protection system as claimed in claim 1 wherein the excursion predictor is configured to determine the predicted excursion based on the audio signal and a second loudspeaker impulse response model.

9. A loudspeaker protection system as claimed in claim 1 wherein the second loudspeaker impulse response model comprises a second series of impulse response coefficients.

10. A loudspeaker protection system as claimed in claim 1 wherein the delay block delays the audio signal for a delay time which is less than the impulse response settling time of the loudspeaker.

11. A loudspeaker protection system as claimed in claim 1:

wherein the gain controller determines a first set of gain settings for a first set of samples of the audio signal delayed by the delay block based on a first predicted excursion and subsequently determines at least a second subsequent set of gain settings for a second set of samples of the audio signal delayed by the delay block based on a subsequent predicted excursion;

wherein the second set of samples partly overlaps with the first set of samples; and wherein the gain controller is configured to use, for any sample in both the first and second sets, the lowest respective gain setting of the first and second sets of gain settings that correspond to that sample.

12. A loudspeaker protection system as claimed in claim 1 wherein the gain controller is further configured to determine said at least one gain setting for the set of samples based on a constraint on velocity of the loudspeaker coil.

13. A loudspeaker protection system as claimed in claim 1 wherein the gain controller is configured to determine said at least one gain setting for set of samples in a frequency band that corresponds to a subset of the frequency range of the audio signal.

14. An apparatus comprising a loudspeaker protection system, wherein the loudspeaker protection system comprises:

an input node for receiving a digital audio signal comprising a plurality of samples;

a delay block for delaying the digital audio signal;

a gain block for applying a controlled gain to the delayed digital audio signal output from the delay block;

an excursion predictor configured to receive a version of the audio signal from the signal path upstream of the delay block and determine a predicted excursion for a loudspeaker based on the audio signal; and a gain controller for controlling a gain setting of the gain block in response to the predicted excursion and a first loudspeaker impulse response model and a predetermined excursion limit, wherein the gain controller is configured to determine at least one gain setting to be applied to a set of samples of the audio signal delayed by the delay block; and wherein said set of samples of the audio signal correspond to a time-span which is less than an impulse response settling time of the loudspeaker, wherein the impulse response settling time of the loudspeaker is the duration of the first two lobes of impulse response.

15. An apparatus as claimed in claim 14 further comprising a digital-to-analogue converter downstream of the gain block.

16. An apparatus as claimed in claim 14 further comprising an amplifier downstream of the gain block.

17. An apparatus as claimed in claim 14 further comprising a loudspeaker configured to be driven by a drive signal wherein the drive signal is derived from the output of the gain block.

18. An apparatus as claimed in claim 14 wherein the apparatus is at least one of: a portable device; a battery powered device; a wearable device; a computing device; a communications device; a gaming device; a mobile telephone; a personal media player; a laptop, tablet or notebook computing device.

19. A loudspeaker excursion limiter comprising:

an input for receiving digital input signal comprising a stream of samples;

an output for outputting an audio signal for a loudspeaker;

a signal path from said input to said output comprising a delay block and a gain block, wherein the gain block is downstream of the delay block and applies a gain controlled by a gain calculation block; and an excursion predictor block configured to estimate loudspeaker excursion based on the digital input signal and a first loudspeaker model;

wherein:

said gain calculation block determines a set of gains to be applied to a sequential set of delayed samples based on the currently estimated loudspeaker excursion, a predefined excursion limit and a loudspeaker impulse response model; and the time-span of said sequential set of delayed samples is less than a loudspeaker impulse response settling time, wherein the impulse response settling time of the loudspeaker is the duration of the first two lobes of impulse response.

* * * * *